(12) United States Patent
Cesura et al.

(10) Patent No.: US 7,084,791 B2
(45) Date of Patent: Aug. 1, 2006

(54) ANALOG-TO-DIGITAL CONVERTER WITH CORRECTION OF OFFSET ERRORS

(75) Inventors: Giovanni Cesura, Cremona (IT); Andrea Panigada, Pavia (IT); Nadia Serina, Monza (IT)

(73) Assignee: STMicroelectronics, S.R.L., Agrate Brianza (IT)

( * ) Notice: Subject to any disclaimer, the term of this patent is extended or adjusted under 35 U.S.C. 154(b) by 17 days.

(21) Appl. No.: 10/781,570

(22) Filed: Feb. 18, 2004

(65) Prior Publication Data

US 2004/0233081 A1    Nov. 25, 2004

(30) Foreign Application Priority Data

Feb. 18, 2003    (EP)    .................................. 03425094

(51) Int. Cl.
H03M 1/06    (2006.01)
H03M 1/38    (2006.01)

(52) U.S. Cl. ....................... 341/118; 341/161

(58) Field of Classification Search ................ 341/118, 341/120, 155, 161, 162, 115, 143; 324/132; 369/47.35; 455/232.1; 375/232
See application file for complete search history.

(56) References Cited

U.S. PATENT DOCUMENTS

| | | | | |
|---|---|---|---|---|
| 3,641,563 A | * | 2/1972 | Cushman et al. | ........... 341/115 |
| 4,051,470 A | * | 9/1977 | Esteban et al. | ............. 341/118 |
| 4,251,803 A | | 2/1981 | Debord et al. | .............. 341/118 |
| 4,947,168 A | * | 8/1990 | Myers | ......................... 341/120 |
| 4,972,189 A | * | 11/1990 | Polito et al. | ................. 341/118 |
| 5,142,552 A | * | 8/1992 | Tzeng et al. | ................. 375/232 |
| 5,172,115 A | * | 12/1992 | Kerth et al. | ................. 341/118 |
| 5,479,096 A | * | 12/1995 | Szczyrbak et al. | .......... 324/132 |
| 5,594,445 A | * | 1/1997 | Ginetti | ........................ 341/162 |
| 5,812,077 A | * | 9/1998 | Boie | ........................... 341/118 |
| 5,898,395 A | | 4/1999 | Werrbach et al. | ........... 341/118 |

(Continued)

FOREIGN PATENT DOCUMENTS

EP    0 483 846    5/1992

(Continued)

OTHER PUBLICATIONS

European Search Report dated Jul. 10, 2003 for European Application No. 03425094.

*Primary Examiner*—Patrick Wamsley
(74) *Attorney, Agent, or Firm*—Lisa K. Jorgenson; Jose Gutman; Fleit, Kain, Gibbons, Gutman, Bongini & Bianco P.L.

(57) ABSTRACT

An analog-to-digital converter (200) includes at least one stage (105) for converting an analog input signal into a digital output signal using a parallel quantizer (115) comparing the analog input signal with a plurality of threshold values in parallel. The analog-to-digital converter includes, for at least one selected stage (105), an estimating circuit (210,220) for estimating an analog correction signal indicative of the mean value of a quantization error of the selected stage, and a compensating circuit (440i) for at least partially compensating an offset error of the parallel quantizer (105) in the selected stage according to the analog correction signal. A method and computing system are also provided.

30 Claims, 4 Drawing Sheets

U.S. PATENT DOCUMENTS

| | | | |
|---|---|---|---|
| 6,111,529 A * | 8/2000 | Maulik et al. | 341/120 |
| 6,124,820 A * | 9/2000 | Norman | 341/161 |
| 6,191,715 B1 * | 2/2001 | Fowers | 341/120 |
| 6,229,467 B1 * | 5/2001 | Eklund et al. | 341/120 |
| 6,323,791 B1 * | 11/2001 | Murden et al. | 341/118 |
| 6,522,282 B1 * | 2/2003 | Elbornsson | 341/155 |
| 6,642,874 B1 * | 11/2003 | Lin et al. | 341/143 |
| 6,693,863 B1 * | 2/2004 | Shoji et al. | 369/47.35 |
| 6,735,422 B1 * | 5/2004 | Baldwin et al. | 455/232.1 |
| 6,867,718 B1 * | 3/2005 | Cesura et al. | 341/118 |
| 6,965,332 B1 * | 11/2005 | Nakamura et al. | 341/118 |
| 6,970,125 B1 * | 11/2005 | Cesura et al. | 341/161 |
| 2002/0041247 A1 | 4/2002 | Steensgaard-Madsen | |

FOREIGN PATENT DOCUMENTS

| | | | |
|---|---|---|---|
| EP | 1450490 | * | 8/2004 |
| JP | 60029025 | | 2/1985 |

* cited by examiner

ANALOG-TO-DIGITAL CONVERTER WITH CORRECTION OF OFFSET ERRORS

CROSS-REFERENCE TO RELATED APPLICATION

This application is based upon and claims priority from prior European Patent Application No. 03425094.4, filed on Feb. 18, 2003, the entire disclosure of which is herein incorporated by reference.

BACKGROUND OF THE INVENTION

1. Field of the Invention

The present invention relates in general to the field of analog-to-digital conversion circuits or converters (ADCs).

2. Description of the Related Art

Analog-to-digital converters (ADCs) are commonly used in several applications (for example, in the telecommunication field), whenever an analog input signal is to be converted into a corresponding digital output signal. The basic component of every converter is a quantizer. The quantizer compares an analog signal with one or more predefined threshold values; the combination of the results of the comparisons uniquely identifies the digital representation of the analog signal. In order to achieve a high resolution of the whole converter, quantizer of the parallel type are commonly used; in this case, the analog signal is compared with multiple threshold values at the same time.

However, the inherent imprecision of the technological processes used to implement the converter brings about an error in each threshold value of the quantizer. The error has a common component (equal to the mean value of the errors in all the threshold values) and a differential component (equal to the error in each threshold value minus the common component). The differential error causes a harmonic distortion in the resulting digital signal, which distortion jeopardizes the linearity of the whole converter; instead, the common component introduces an offset in the digital signal.

Many solutions are known in the art for reducing the effects of the differential errors in the digital signal. Conversely, the offset errors have been (wrongly) deemed not particularly deleterious for the performance of the converter; therefore, the effects of the offset errors have not been investigated thoroughly.

Particularly, some converters (such as the converters of the sigma-delta type) implement a feedback loop that compensates the offset errors to a certain extent (without adversely affecting the accuracy of the converter). However, different remarks apply to converters having a multistage architecture. In this case, the converter includes a sequence of cascade-connected stages providing successive approximations of the digital output signal. For this purpose, each stage performs a low-resolution conversion; a residue of the corresponding analog signal, representing a quantization error of the conversion, is then amplified by an inter-stage gain and passed to a next stage in the sequence (so as to ensure that each stage operates with a similar input signal range).

As a consequence, the offset error in the quantizer of each stage (with the exception of the last one) affects the dynamic range of the analog signal that is input to the next stages; this change in the dynamic range can cause an overflow in the respective quantizer. The problem is particular acute in the first stages of the converter (since the corresponding offset error is amplified by all the next stages).

The only solution known in the art for solving the above-mentioned problem is to scale down the analog signal that is input to the next stages of the converter; this result is achieved reducing the corresponding inter-stage gain, and then the dynamic range of the analog signal. However, the proposed solution strongly reduces the actual resolution that can be achieved by the converter.

This drawback is particular acute in applications working with wide-band signals and requiring high resolutions (for example, in modern mobile telecommunication techniques such as the UMTS). In this case, a commonplace solution is that of using a sigma-delta ($\Sigma\Delta$), or delta-sigma ($\Delta\Sigma$) architecture.

In a sigma-delta converter, the analog input signal is oversampled at a rate far higher than the one of the Nyquist theorem (i.e., twice the bandwidth of the signal); the oversampling spreads the quantization error power over a large band, so that its density in the band of the analog input signal is reduced; typical values of an OverSampling Rate (OSR) are from 32 to 64. The sigma-delta converter reacts to the changes in the analog input signal, thereby performing a delta modulation (from which the name "delta"). A corresponding analog delta signal is applied to one or more filters (through a feed-back loop). Each filter integrates the analog delta signal (from which the name "sigma"), and contours the quantization error so that its spectrum is not uniform; this process (known as noise shaping) pushes the quantization error power out of the band of the analog input signal. The resulting analog signal is quantized by means of a very low resolution ADC (typically, at 1 bit). The digital signal so generated is filtered, in order to suppress the out-of-band quantization error; at the same time, a decimator downsamples the digital signal extracting higher resolution at a lower rate. This architecture provides good performance at very low cost.

The number of filters, in the sigma-delta converter defines the degree of noise-shaping (referred to as the order of the sigma-delta converter). Sigma-delta converters with a single-loop structure are typically designed with an order of one or two because of instability problems. Whenever a higher order is required, a multistage architecture implementing two or more loops is commonly used. A multistage architecture including at least one sigma-delta converter, also known as MASH (MultistAge noise SHaping), is inherently stable; moreover, a MASH converter provides performance comparable to the one of a single-loop converter having an order equal to the sum of the orders of the different stages of the MASH converter.

Additional problems arise with wide-band signals. In this case, the sampling frequency of the analog input signal is limited by the technological restraints, so that the oversampling rate must be relatively low (for example, 4–8). Moreover, the use of sigma-delta converters of high order is substantially useless, since the noise-shaping is unable to push the quantization error out of the (wide) band of interest. Therefore, the resolution of the quantizer included in every stage of the sigma-delta converter is the last parameter on which it is possible to act, in order to achieve the desired performance (thereby introducing the offset errors described above).

Accordingly, there exists a need for overcoming the disadvantages of the prior art as discussed above.

SUMMARY OF THE INVENTION

According to an embodiment of the present invention, an analog-to-digital converter includes at least one stage for converting an analog input signal into a digital output signal using a parallel quantizer comparing the analog input signal with a plurality of threshold values in parallel, wherein the converter further includes, for at least one selected stage, means for estimating an analog correction signal indicative of the mean value of a quantization error of the selected stage, and means for at least partially compensating an offset error of the parallel quantizer in the selected stage according to the analog correction signal.

Moreover, a corresponding analog-to-digital conversion method is also encompassed.

BRIEF DESCRIPTION OF THE DRAWINGS

Further features and the advantages of the solution according to the present invention will be made clear by the following description of a preferred embodiment thereof, given purely by way of a non-restrictive indication, with reference to the attached figures, in which.

DESCRIPTION OF THE PREFERRED EMBODIMENTS

Figure 1:
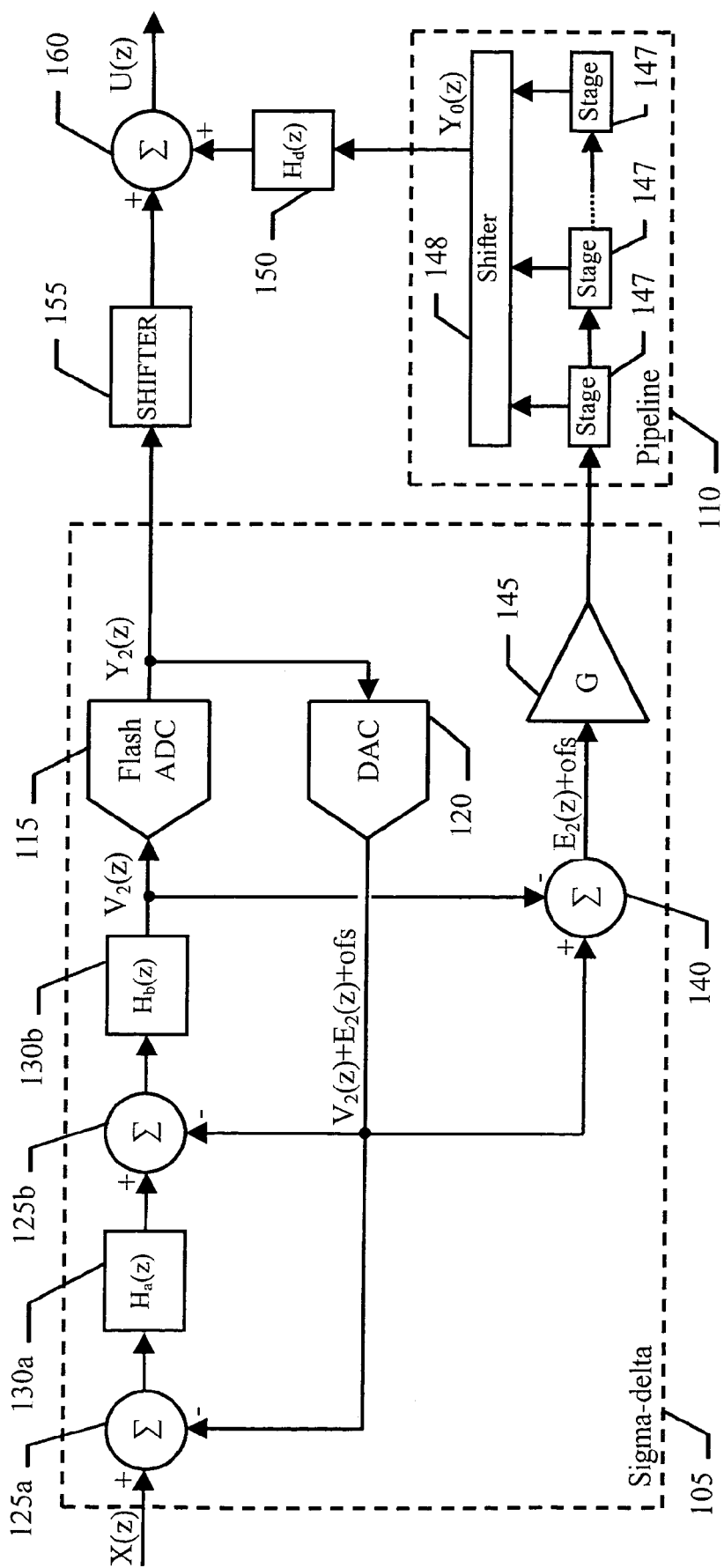
FIG. 1 is a schematic block diagram of a converter known in the art.

With reference in particular to FIG. 1, an Analog-To-Digital (ADC) converter 100 is shown. The converter 100 receives a (continuous) wide-band analog input signal, denoted with X(z) in the z-transform domain; the analog input signal X(z) is oversampled at a relatively low OSR, such as 4 or 8. The analog input signal X(z) is converted into a corresponding digital output signal U(z), which consists of discrete samples taken at evenly spaced intervals.

The converter 100 has a multistage architecture, with a plurality of cascade-connected stages. In the example shown in the FIG. 1, the converter 100 includes a first stage 105 consisting of a sigma-delta converter of the second order; the sigma-delta stage 105 is followed by a stage 110 of the pipeline type. The above-described structure defines a MASH architecture. A MASH converter is commonly designated adding, for each stage, a number denoting the order of the stage (the number is set to 0 for a stage that is not of the sigma-delta type); therefore, the converter 100 at issue will be denoted with $MASH_{20}$.

In detail, the sigma-delta stage 105 converts the analog input signal X(z) into a corresponding digital (local) output signal $Y_2(z)$ at 4 bits. For this purpose, the sigma-delta stage 105 exploits a flash ADC 115 with even resolution (i.e., discriminating $2^4=16$ levels of its analog input signal). The digital output signal $Y_2(z)$ represents the analog input signal X(z) with the addition of a residue $E_2(z)$ introduced by the quantization error of the flash ADC 115 (in the following, the analog signals and the corresponding digital signals will be denoted with the same symbols for the sake of simplicity). Moreover, the digital output signal $Y_2(z)$ includes an offset ofs introduced by the flash ADC 115.

The digital output signal $Y_2(z)$ is applied to a digital-to-analog (DAC) converter 120. The DAC 120 re-converts the digital output signal $Y_2(z)$ into a corresponding analog signal. An adder 125a subtracts the analog output signal $Y_2(z)$ from the analog input signal X(z). The resulting analog delta signal is provided to a filter 130a. The filter 130a integrates the analog delta signal and shapes the quantization error according to a transfer function $H_a(Z)$ of the filter 130a. A further adder 125b subtracts the analog output signal $Y_2(z)$ from the analog signal provided by the filter 130a. The resulting analog delta signal is applied to a further filter 130b, which performs an additional noise shaping process based on its transfer function $H_b(z)$. Therefore, the filter 130b provides an analog signal $V_2(z)$ that is shaped according to the transfer functions $H_a(z)$ and $H_b(z)$; this analog shaped signal $V_2(z)$ is then supplied to the flash ADC 115, which delivers the digital output signal $Y_2(z)$.

The sigma-delta stage 105 further includes an adder 140, which subtracts the analog shaped signal $V_2(z)$ from the analog output signal $Y_2(z)=V_2(z)+E_2(z)+ofs$. The resulting analog signal $E_2(z)+ofs$ is applied to an amplifier 145 having an analog inter-stage gain $G=2^B$. The analog signal generated by the amplifier 145 is then passed to the pipeline stage 110; in this way, the pipeline stage 110 operates with a similar input signal range (being the dynamic of the analog residue $E_2(z)$ equal to $X(Z)/2^B$).

The pipeline stage 110 includes multiple cascade-connected sub-stages 147; each sub-stage 147 performs a low-resolution conversion (by means of a corresponding flash ADC) and provides an analog signal, indicative of a quantization error of the conversion, to the next sub-stage 147. A shifter 148 combines the results of the conversions performed by the different sub-stages 147 into a digital output signal $Y_0(z)$. For example, the pipeline stage 110 includes 6 sub-stages 147 each one having a flash ADC at 1.5 bit (i.e., discriminating 3 levels of the corresponding analog input signal), so as to achieve a total resolution of the digital output signal $Y_0(z)$ equal to 1.5*6=9 bits. A digital filter $(H_d(Z))$ 150 removes the effects of the shaping in the analog residue $E_2(z)$ from the digital output signal $Y_0(z)$.

The pipeline stage 110 (together with the digital filter 150) directly generates the 9 least significant bits (LSB) of the digital output signal U(z). The sigma-delta stage 105 provides the 7 more significant bits (MSB) of the digital output signal U(z); therefore, a shifter 155 multiplies the output digital signal $Y_2(z)$, from the flash ADC 115, by a digital weight equal to $2^9$. An adder 160 sums the digital signal from the filter 150 and the digital signal from the shifter 155, in order to combine them into the overall digital output signal U(z).

The digital output signal U(z) is then downsampled by a decimator circuit (not shown in the figure). In this way, the decimator generates the desired number of bits (for example, 7) of the digital output signal U(z) and restores its correct sample rate. At the same time, the decimator filters the digital output signal U(z) in the band of interest so as to suppress the out-of-band quantization error.

Figure 2:
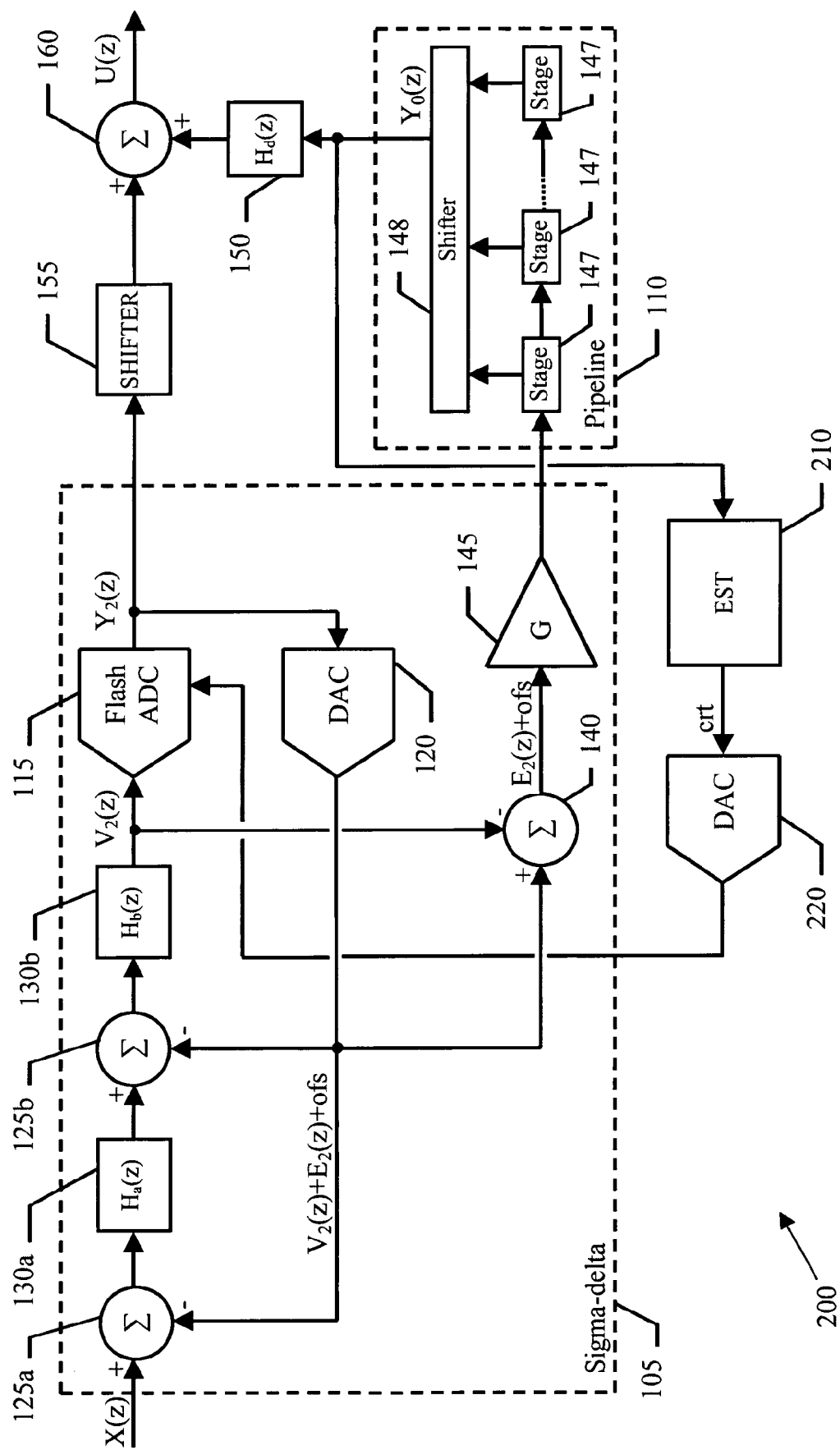
FIG. 2 shows a preferred embodiment of the converter according to the present invention.

Considering now FIG. 2, a converter 200 according to a preferred embodiment of the present invention is shown (the elements corresponding to the ones shown in FIG. 1 are denoted with the same references, and their explanation is omitted for the sake of simplicity).

The invention is based on the intuition that an estimation of the offset error of each flash ADC can be extracted from an analysis of the corresponding quantization error. In fact, the theoretical quantization error should have a mean value equal to zero and a substantially uniform distribution (between +LSB/2 and −LSB/2, wherein LSB is the quantization step of the flash ADC). The offset error is a constant value that is introduced in the same position as the quantization error, and then modifies its mean value. Therefore, in the proposed algorithm the actual mean value of the quantization error is estimated; the offset error of the flash ADC is then compensated accordingly.

For this purpose, the digital signal $Y_0(z)$ output by the pipeline stage 110 is supplied to a logic module (EST) 210. As described in detail in the following, the logic module 210 calculates a digital correction signal crt (for example, at 5 bits) that approximates the analog offset ofs of the flash ADC 115. A servo-DAC 220 converts the digital correction signal crt into a corresponding analog signal. The analog correction signal crt is then used to introduce an opposed offset into the flash ADC 115, so as to compensate the effects of its offset error (at least partially).

Particularly, the maximum offset error that can be compensated is determined by the absolute value of the weights that the servo-DAC 220 assigns to the bits of the digital correction signal crt. These weights are selected according to the characteristics of the flash ADC 115. Empirical considerations suggest to set the dynamic range of the analog correction signal crt to a value proportional to the dynamic range of the analog residue $E_2(z)$.

In detail, if Vfs is the full-scale value of the flash ADC 115, the maximum dynamic range of the analog shaped signal $V_2(z)$ is from −Vfs to +Vfs; therefore, the quantization step of the flash ADC 115 (at 16 levels) will be LSB=2Vfs/16. The dynamic range of the analog residue $E_2(z)$ is from −LSB/2 to +LSB/2, that is from −Vfs/16 to +Vfs/16. For example, let us assume that we desire to compensate a maximum offset error equal to the dynamic range of the quantization error. In the flash ADC 115 at issue (wherein the analog correction signal crt has a resolution of 5 bits, that is from −15 to +15), the weight of the least significant bit of the servo-DAC 220 should be Vfs/(16*15).

However, the concepts of the present invention are also applicable when the converter includes another number of stages, when each stage is of a different type, or when the digital signals output by the stages are combined in another way. Similar considerations apply if the converter, the stages and the corresponding flash ADCs have different resolutions, if the flash ADC is replaced with an equivalent parallel quantizer, if the weight of the bits of the servo-DAC is different, and the like. Alternatively, the correction of the offset error is applied to a different number of stages of the converter (even to all of them, with the exception of the last stage).

Figure 3:
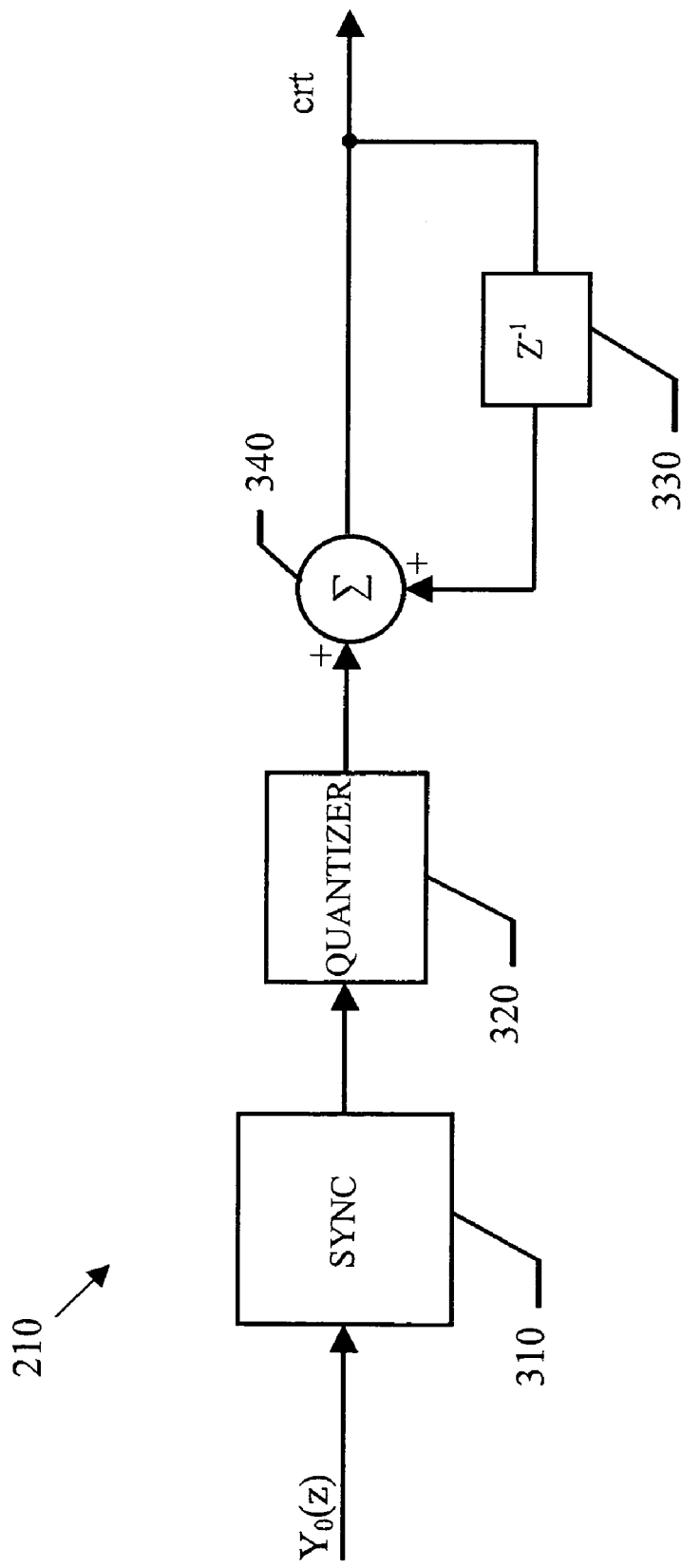
FIG. 3 depicts the functional blocks of a logic module of the converter.

Moving now to FIG. 3, the logic module 210 includes a digital (or sync) filter 310 receiving the digital output signal $Y_0(z)$ from the pipeline stage. The sync filter 310 calculates the mean value of a number of samples of the digital output signal $Y_0(z)$, as defined by a decimation parameter (for example, 128). The result of this operation consists of a digital signal that is proportional to a residual error caused by the offset (of the flash ADC in the sigma-delta converter) still to be corrected; the digital residual error has a high resolution equal to the one of the whole pipeline stage (i.e., 9 bits). A quantizer 320 discards the least significant bits of the digital residual error, so as to reduce its resolution to the desired value (5 bits in the example at issue).

The resulting digital signal is provided to an integrator, which calculates the digital correction signal crt. In detail, a delay block ($Z^{-1}$) 330 (implemented with a bank of flip-flops) accumulates the digital correction signal crt. An adder 340 sums the digital residual error to the (previous) digital correction signal crt, which is provided by the delay block 330 with a feedback loop. The resulting (current) digital correction signal crt is then latched by the delay block 330. In this way, the digital correction signal crt converges towards the digital representation of the analog offset ofs (until the digital residual error falls below a threshold value).

The decimation parameter of the sync filter 310 defines the precision and the convergence speed of the process. High values of the decimation parameter increase the number of samples taken into consideration at every estimation step, and then also the precision of the sync filter 310; however, this slows down the convergence speed of the process (since the digital correction signal crt is updated with a lower frequency). Conversely, low values of the decimation parameter increase the convergence speed of the process, but reduce its precision.

However, the concepts of the present invention are also applicable when the logic module has another structure or includes equivalent components; similar considerations apply if the decimation parameter of the sync filter has a different value, if the digital signals have another resolution, and the like.

Figure 4:
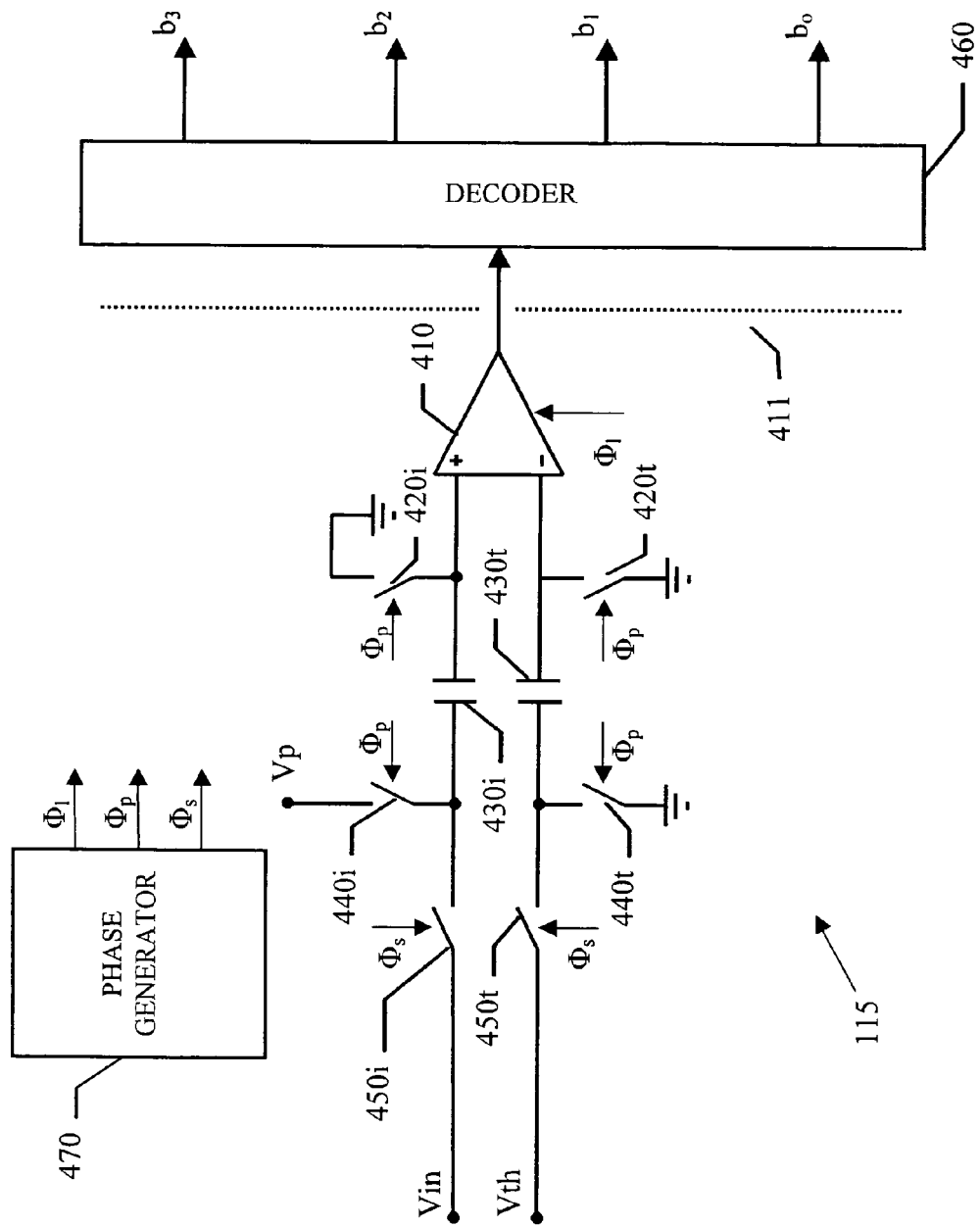
FIG. 4 is a circuit scheme implementing a compensation of the offset error.

A circuit scheme of the flash ADC 115 (in the sigma-delta stage) is illustrated in FIG. 4; the flash ADC 115 is based on a switched-capacitor architecture, which is modified to implement a compensation of its offset error. The flash ADC 115 receives an input voltage Vin, representing the analog signal $V_2(z)$, and outputs 4 bits $b_3b_2b_1b_0$, representing the digital signal $Y_2(z)$. The input voltage Vin is simultaneously compared with multiple threshold voltages Vth, each one identifying an upper limit of a corresponding level of the input voltage to be discriminated (16 in the example at issue); typically, the threshold voltages Vth are generated by means of a resistive ladder (not shown in the figure).

In order to perform the above-mentioned comparisons, the flash ADC 115 includes an even number of comparators 410 (only one explicitly shown in the figure but a plurality of comparators being indicated by the ellipses 411), which comparators operate in parallel. Each comparator 410 is actuated by a latching signal $\Phi_l$. The comparator 410 has a non-inverting input terminal (+), which is connected to a ground terminal through an electronic switch 420$i$ (for example, implemented with a MOS transistor); the switch 420$i$ is controlled by a pre-charging signal $\Phi_p$. Likewise, an inverting input terminal (−) of the comparator 410 is connected to the ground terminal through a switch 420$t$, which is controlled by the same pre-charging signal $\Phi_p$.

The non-inverting terminal of the comparator 410 is further connected to a first terminal of a capacitor 430$i$. A pre-charging voltage Vp (corresponding to the analog correction signal crt) is applied to a second terminal of the capacitor 430$i$ through a switch 440$i$; alternatively, the second terminal of the capacitor 430$i$ receives the input voltage Vin through a further switch 450$i$. The switch 440$i$ is controlled by the pre-charging signal $\Phi_p$, whereas the switch 450$i$ is controlled by a sampling signal $\Phi_s$. On the other hand, the inverting terminal of the comparator 410 is further connected to a first terminal of a capacitor 430$t$. A second terminal of the capacitor 430$t$ is connected to the ground terminal through a switch 440$t$ or receives the threshold voltage Vth through a switch 450$t$; the switch 440$t$ is controlled by the pre-charging signal $\Phi_p$, whereas the switch 450$t$ is controlled by the sampling signal $\Phi_s$.

The signals output by all the comparators 410 are supplied to a decoder 460. The decoder 460 delivers the bits $b_3b_2b_1b_0$, which uniquely identify the level of the input voltage Vin (according to the results of the comparisons performed by the comparators 410). A phase generator circuit 470 provides the signals $\Phi_l$, $\Phi_p$, $\Phi_s$ controlling operation of the flash ADC 115.

During every period of a clock signal (which synchronizes the whole convert), the pre-charging signal $\Phi_p$ is at first asserted (with all the other signals $\Phi_s$ and $\Phi_l$ that are deasserted). In this way, the switches 420$i$,440$i$ and 420$t$, 440$t$ are closed (while the switches 450$i$ and 450$t$ are open); as a consequence, the capacitor 430$i$ is pre-charged to the voltage Vp and the capacitor 430$t$ is discharged to ground. The pre-charging signal $\Phi_p$ is kept asserted for a time interval (slightly shorter than half a period of the clock signal) ensuring the correct reset of the capacitors 430$i$,430$t$. The pre-charging signal $\Phi_p$ is then deasserted (opening the switches 420$i$,440$i$ and 420$t$,440$t$), and the sampling signal $\Phi_s$ is asserted after a short delay (so that the two signals are disoverlapped). In this way, the switches 450$i$ and 450$t$ are closed; as a consequence, the capacitor 430$i$ is charged to the input voltage Vin plus the pre-charging voltage Vp and the capacitor 430$t$ is charged to the threshold voltage Vth. The sampling signal $\Phi_s$ is then deasserted (opening the switches 450$i$ and 450$t$), and the latching signal $\Phi_l$ is in turn asserted.

The latching signal $\Phi_l$ consists of a short pulse, which actuates the comparison of the voltages at the non-inverting terminal and at the inverting terminal of the comparator 410. Particularly, the non-inverting terminal receives the voltage on the capacitor 430$i$ (Vin+Vp), whereas the inverting terminal receives the voltage on the capacitor 430$t$ (Vth). Therefore, the signal output by each comparator 410 of the flash ADC 115 is asserted only when the input voltage Vin (with the addition of the pre-charging voltage Vp) exceeds the corresponding threshold voltage Vth. The decoder 460 then generates the bits $b_3b_2b_1b_0$ accordingly.

The circuit described-above introduces an offset opposed to the one generated by the comparator 410 internally (for example, due to the mismatching of the resistors forming the ladder). In this way, the effects of the offset error in the flash ADC 115 are substantially suppressed (within the limits of the desired precision).

However, the concepts of the present invention are also applicable when the flash converter includes equivalent components, or when different signals are used to control its operation. Similar considerations apply if the capacitors are pre-charged with another procedure, or if the pre-charging is applied to the capacitors associated with the threshold voltages (instead of the ones associated with the input voltage). Alternatively, the flash converter has another architecture or includes a different number of capacitors (down to a single one for sampling and holding the input voltage).

More generally, the present invention proposes an analog-to-digital converter. The converter includes one or more stages for converting an analog input signal into a digital output signal; for this purpose, each stage uses a parallel quantizer that compares the analog input signal with a plurality of threshold values in parallel. The converter of the invention further includes, for one or more selected stages, means for estimating an analog correction signal indicative of the mean value of a quantization error of the selected stage; means are then provided for at least partially compensating an offset error of the parallel quantizer in the selected stage according to the analog correction signal.

The solution of the invention substantially reduces the effects of the offset errors introduced by the parallel quantizer.

The algorithm implemented by the proposed structure is self-adaptive, and allows correcting the offset error with the desired precision in a very simple manner.

This result is achieved in the background, without interfering with operation of the converter.

The preferred embodiment of the invention described above offers further advantages.

Particularly, the proposed solution is implemented in a converter with a multistage architecture.

In this case, the analog residue required to estimate the analog correction signal is already available in the converter (being used to generate the analog input signal for the next stage); therefore, the algorithm of the invention can be implemented with the addition of a few circuit elements. The devised solution avoids reducing the dynamic range of the analog signal that is input to the next stages (as done in the prior art to prevent an overflow in the corresponding quantizer); this results in an increased resolution of the converter. The above-mentioned advantages are clearly perceived in applications working with wide-band signals and requiring high resolutions (for example, when the converter has a MASH architecture); however, different applications of the invention are contemplated (such as in a pipeline converter).

Preferably, the algorithm of the invention at first calculates a digital correction signal from the digital representation of the analog residue passed to the next stages; the digital correction signal is then converted into a corresponding analog signal.

The proposed solution operates in the digital domain; therefore, it does not adversely affect the stability of the whole converter.

However, the use of the proposed algorithm in a converter with a single stage is not excluded (even if it is far less advantageous and requires more dedicated circuit elements). Moreover, the algorithm is also suitable to be implemented in the analog domain; for example, a copy of the analog residue is filtered so as to extract its direct component (representing the offset error).

A suggested choice for calculating the digital correction signal is to use the whole digital signal resulting from the conversions performed by multiple stages following the selected stage.

In this way, the mean value of the analog residue can be estimated with a very high accuracy.

Preferably, each stage following the selected one has a resolution lower than the one of the selected stage.

As a consequence, the offset error introduced by these stages is negligible (being virtually zero when their resolution is equal to 1 bit). Therefore, the offset errors of the stages following the selected one do not substantially affect the digital residue, and then the estimation of the analog correction signal.

As a further improvement, the resolution of the digital correction signal is reduced (before its conversion into the corresponding analog signal).

This additional feature avoids the need of using a servo-DAC that is very accurate and expensive. Moreover, it increases the stability of the whole converter. The corresponding loss of resolution does not substantially affect the effectiveness of the algorithm; in fact, the solution of the invention does not require a very high accuracy (being enough to ensure that the analog correction signal avoids the overflow of the next stages).

Alternatively, the digital correction signal is calculated only from the digital signal output by the stage directly following the selected one (thereby reducing the resolution of the digital correction signal but avoiding the addition of the offset errors of the next stages); moreover, the solution of the present invention leads itself to be implemented even with a different resolution of the stages following the selected one, or without reducing the resolution of the digital correction signal.

Advantageously, the analog correction signal has a dynamic range proportional to the one of the corresponding quantization error.

This choice facilitates the appropriate selection of the maximum offset error that can be compensated.

A suggested choice for calculating the digital correction signal is to use a sync filter followed by an integrator.

The proposed structure ensures the convergence of the algorithm; moreover, the decimation parameter of the sync filter makes it possible to control either the precision or the convergence speed of the process.

Without detracting from the general applicability of the invention, the offset error is compensated pre-charging at least one capacitor (providing one of the input voltages for each comparator in the flash ADC).

This solution is very simple, but at the same time effective.

However, the devised algorithm is also suitable to be implemented setting the dynamic range of the analog correction signal in a different manner, calculating the digital correction signal with alternative circuit solutions, or even compensating the offset error in another way or position.

Naturally, in order to satisfy local and specific requirements, a person skilled in the art may apply to the solution described above many modifications and alterations all of which, however, are included within the scope of protection of the invention as defined by the following claims.

The present invention is not limited to the examples described above. Many alternative embodiments are possible without departing from the scope defined by the appended claims. For example, it should be obvious to those of ordinary skill in the art in view of the present discussion that alternative embodiments of the new and novel analog to digital converter circuit may be implemented in an integrated circuit comprising a circuit supporting substrate that supports at least a portion of the new and novel circuit discussed above. Additionally, the new and novel analog to digital converter circuit may be implemented in a computing system comprising a computing circuit and at least one such analog to digital converter circuit thereby providing the advantages of the present invention to such computing system.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An analog-to-digital converter comprising:
    at least one stage for converting an analog input signal into a digital output signal using a parallel quantizer comparing the analog input signal with a plurality of threshold values in parallel;
    means, electrically coupled with at least one selected stage of the at least one stage, for estimating an analog correction signal indicative of the mean value of a quantization error of the at least one selected stage; and
    means for compensating, electrically coupled with the at least one selected stage, for at least partially compensating an offset error of the parallel quantizer in the at least one selected stage according to the analog correction signal.

2. The analog-to-digital converter according to claim 1, comprising:
    a plurality of stages, including the at least one stage and at least one further stage, the plurality of stages being cascade-connected in a sequence, and wherein each stage different from a last stage in the sequence includes
    means for determining an analog residue indicative of the corresponding quantization error; and
    means for generating the analog input signal for a next stage in the sequence according to the analog residue.

3. The analog-to-digital converter according to claim 2 wherein the means for estimating includes means for calculating a digital correction signal indicative of the mean value of a digital residue consisting of a digital representation of the analog residue provided by the digital output signal of at least one stage following the at least one selected stage in the sequence, and means for converting the digital correction signal into the analog correction signal.

4. The analog-to-digital converter according to claim 3, wherein the at least one stage following the at least one selected stage consists of a plurality of stages, the converter further including means for combining the digital output signals of the plurality of stages following the selected stage into the digital residue.

5. The analog-to-digital converter according to claim 4 wherein each stage following the at least one selected stage has a resolution lower than the resolution of the at least one selected stage.

6. The analog-to-digital converter according to claim 5, further including means for reducing the resolution of the digital correction signal to a predefined value.

7. The analog-to-digital converter according to claim 6, wherein the means for calculating the digital correction signal includes a digital filter for providing a digital residual error indicative of the mean value of a predefined number of samples of the digital residue and an integrator for converging towards the digital correction signal according to the digital residual error.

8. The analog-to-digital converter according to claim 5, wherein the analog correction signal has a dynamic range proportional to the dynamic range of the corresponding quantization error according to a predefined factor.

9. The analog-to-digital converter according to claim 5, wherein the means for calculating the digital correction signal includes a digital filter for providing a digital residual error indicative of the mean value of a predefined number of samples of the digital residue and an integrator for converging towards the digital correction signal according to the digital residual error.

10. The analog-to-digital converter according to claim 4, further including means for reducing the resolution of the digital correction signal to a predefined value.

11. The analog-to-digital converter according to claim 4, wherein the analog correction signal has a dynamic range proportional to the dynamic range of the corresponding quantization error according to a predefined factor.

12. The analog-to-digital converter according to claim 4, wherein the means for calculating the digital correction signal includes a digital filter for providing a digital residual error indicative of the mean value of a predefined number of samples of the digital residue and an integrator for converging towards the digital correction signal according to the digital residual error.

13. The analog-to-digital converter according to claim 3, further including means for reducing the resolution of the digital correction signal to a predefined value.

14. The analog-to-digital converter according to claim 13, wherein the analog correction signal has a dynamic range proportional to the dynamic range of the corresponding quantization error according to a predefined factor.

15. The analog-to-digital converter according to claim 14, wherein the means for calculating the digital correction signal includes a digital filter for providing a digital residual error indicative of the mean value of a predefined number of samples of the digital residue and an integrator for converging towards the digital correction signal according to the digital residual error.

16. The analog-to-digital converter according to claim 3, wherein each stage following the at least one selected stage has a resolution tower than the resolution of the selected stage.

17. The analog-to-digital converter according to claim 3, wherein the means for calculating the digital correction signal includes a digital filter for providing a digital residual error indicative of the mean value of a predefined number of samples of the digital residue and an integrator for converging towards the digital correction signal according to the digital residual error.

18. The analog-to-digital converter according to claim 2, wherein the parallel quantizer in the at least one selected stage includes a plurality of comparators each one for comparing a first voltage corresponding to the analog input signal with a second voltage corresponding to a respective threshold value, and at least one capacitor for sampling the first voltage or the second voltage, the means for compensating including means for charging the at least one capacitor to a voltage corresponding to the analog correction signal.

19. The analog-to-digital converter according to claim 1, wherein the means for estimating includes
means for calculating a digital correction signal indicative of the mean value of a digital residue consisting of a digital representation of the analog residue provided by the digital output signal of at least one stage following the at least one selected stage in the sequence, and
means for converting the digital correction signal into the analog correction signal.

20. The analog-to-digital converter according to claim 19, wherein the analog-to-digital converter also comprises means for reducing the resolution of the digital correction signal to a predefined value.

21. The analog-to-digital converter according to claim 19, wherein the means for calculating the digital correction signal includes a digital filter for providing a digital residual error indicative of the mean value of a predefined number of samples of the digital residue, and an integrator for converging towards the digital correction signal according to the digital residual error.

22. The analog-to-digital converter according to claim 1, wherein the parallel quantizer in the at least one selected stage includes a plurality of comparators each one for comparing a first voltage corresponding to the analog input signal with a second voltage corresponding to a respective threshold value, and at least one capacitor for sampling the first voltage or the second voltage, the means for compensating including means for charging the at least one capacitor to a voltage corresponding to the analog correction signal.

23. The analog-to-digital converter according to claim 1, wherein the analog correction signal has a dynamic range proportional to the dynamic range of the corresponding quantization error according to a predefined factor.

24. An analog-to-digital conversion method including the steps of:
at least one stage included in an analog-to-digital converter converting an analog input signal into a digital output signal using a parallel quantizer comparing the analog input signal with a plurality of threshold values in parallel; and
for at least one selected stage of the at least one stage,
estimating an analog correction signal indicative of the mean value of a quantization error of the at least one selected stage, and
at least partially compensating an offset error of the parallel quantizer in the at least one selected stage according to the analog correction signal.

25. The analog-to-digital conversion method of claim 24, wherein the analog correction signal has a dynamic range proportional to a dynamic range of the corresponding quantization error according to a predefined factor.

26. A computer system comprising:
a computing circuit; and
at least one analog-to-digital converter (ADC), electrically coupled with the computing circuit, each of the at least one analog-to-digital converter including:
at least one stage for converting an analog input signal into a digital output signal using a parallel quantizer comparing the analog input signal with a plurality of threshold values in parallel;
means, electrically coupled with at least one selected stage of the at least one stage, for estimating an analog correction signal indicative of the mean value of a quantization error of the at least one selected stage; and
means for compensating, electrically coupled with the at least one selected stage, for at least partially compensating an offset error of the parallel quantizer in the at least one selected stage according to the analog correction signal.

27. The computer system according to claim 26, wherein the means for estimating includes
means for calculating a digital correction signal indicative of the mean value of a digital residue consisting of a digital representation of the analog residue provided by the digital output signal of at least one stage following the at least one selected stage in the sequence, and
means for converting the digital correction signal into the analog correction signal.

28. The computer system according to claim 27, wherein the analog-to-digital converter also comprises means for reducing the resolution of the digital correction signal to a predefined value.

29. The computer system according to claim 27, wherein the means for calculating the digital correction signal includes a digital filter for providing a digital residual error indicative of the mean value of a predefined number of samples of the digital residue, and an integrator for converging towards the digital correction signal according to the digital residual error.

30. The computer system according to claim 26, wherein the analog correction signal has a dynamic range proportional to a dynamic range of the corresponding quantization error according to a predefined factor.

* * * * *

UNITED STATES PATENT AND TRADEMARK OFFICE
CERTIFICATE OF CORRECTION

PATENT NO. : 7,084,791 B2
APPLICATION NO. : 10/781570
DATED : August 1, 2006
INVENTOR(S) : Giovanni Cesura et al.

Page 1 of 1

It is certified that error appears in the above-identified patent and that said Letters Patent is hereby corrected as shown below:

Column 11, line 19, from "resolution tower" to -- resolution lower --

Signed and Sealed this

Twenty-eighth Day of November, 2006

JON W. DUDAS
*Director of the United States Patent and Trademark Office*